(12) United States Patent
Ujiie et al.

(10) Patent No.: US 6,950,315 B2
(45) Date of Patent: Sep. 27, 2005

(54) HIGH FREQUENCY MODULE MOUNTING STRUCTURE IN WHICH SOLDER IS PREVENTED FROM PEELING

(75) Inventors: Masanobu Ujiie, Fukushima-ken (JP); Atsushi Murata, Fukushima-ken (JP); Daijo Shibata, Fukushima-ken (JP); Kiminori Terashima, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 143 days.

(21) Appl. No.: 10/440,931

(22) Filed: May 19, 2003

(65) Prior Publication Data

US 2003/0214796 A1 Nov. 20, 2003

(30) Foreign Application Priority Data

May 20, 2002 (JP) ........................................ 2002-143963

(51) Int. Cl.[7] .............................. H05K 7/02; H05K 7/06; H05K 7/08; H05K 7/10
(52) U.S. Cl. ........................ 361/777; 361/768; 174/260
(58) Field of Search ................................ 361/767–768, 361/772–777; 174/260–264; 257/737–738, 772–773, 778–780

(56) References Cited

U.S. PATENT DOCUMENTS

| 3,871,014 A | * | 3/1975 | King et al. .................. 257/779 |
| 5,641,946 A | * | 6/1997 | Shim ........................... 174/261 |
| 6,107,685 A | * | 8/2000 | Nishiyama ................... 257/737 |
| 6,346,679 B1 | * | 2/2002 | Nakamura ................... 174/260 |

FOREIGN PATENT DOCUMENTS

JP          2001-7467          1/2001

* cited by examiner

*Primary Examiner*—Randy Gibson
*Assistant Examiner*—Tuan Dinh
(74) *Attorney, Agent, or Firm*—Brinks Hofer Gilson & Lione

(57) ABSTRACT

In a high-frequency module mounting structure according to the present invention, a circuit board includes a reinforcing electrode on the lower surface thereof for increasing a mounting strength of the first and second electrode groups in a state of being in close proximity, a motherboard includes a reinforcing lands corresponding to the reinforcing electrodes in a state of being in close proximity to the lands, and the electrodes and the lands, and the reinforcing electrodes and the reinforcing lands are soldered. Therefore, soldering of the high-frequency module with respect to the motherboard is enhanced, and thus a reliable high-frequency module mounting structure is provided.

5 Claims, 3 Drawing Sheets

HIGH FREQUENCY MODULE MOUNTING STRUCTURE IN WHICH SOLDER IS PREVENTED FROM PEELING

This application claims the benefit of Japanese Patent Application No. 2002-143963, filed on May 20, 2002, incorporated herein by reference.

BACKGROUND OF THE INVENTION

1. Field of the Invention

The present invention relates to a high-frequency module mounting structure suitable for high-frequency modules, such as an on-vehicle electronic unit or a transmission unit for a mobile phone.

2. Description of the Related Art

Referring now to the drawings showing a high-frequency module mounting structure in the related art, FIG. 4 is a side view showing a high-frequency module mounting structure in the related art, FIG. 5 is an enlarged cross sectional view showing a principal portion of the high-frequency module mounting structure in the related art, and FIG. 6 is the high-frequency module mounting structure in the related art, showing a bottom view of a high-frequency module.

Referring now to FIG. 4 to FIG. 6, the high-frequency module mounting structure in the related art will be described below. A square circuit board 51 formed of a printed board is formed with a wiring pattern (not shown) on one side, and the circuit board 51 is provided with electric components 52, such as a IC part, a chip capacitor, and a chip resistance, in a state of being connected to the wiring pattern, so that a desired electric circuit is formed.

The lower surface of the circuit board 51 is provided with a plurality of electrodes 53 for connecting to an external circuit, as shown in particular in FIG. 6. The electrodes 53 are connected to the wiring pattern via a through hole (connecting conductor) so as to be capable of surface mounting, though it is not shown in the figure.

The electrodes 53 are disposed along four sides of the circuit board 51 by plural number each, and includes first and second electrode groups 54a and 54b disposed along opposed pair of sides respectively and third and fourth electrode groups 55a and 55b disposed along another opposed pair of sides respectively.

A box-shaped cover 56 formed of a metal plate is attached to the circuit board 51 by a suitable measure, such as soldering, so as to cover one side of the circuit board 51.

The cover 56 shields the electric component 52 and the wiring pattern electrically to form a high-frequency module M2.

A motherboard 61 constructed of the printed board is formed with a wiring pattern 62, and a plurality of lands 63 are disposed at predetermined positions of the wiring pattern 62 corresponding to the electrodes 53 of the high-frequency module M2.

The high-frequency module M2 is disposed on the motherboard 61, and the plurality of electrodes 53 and the plurality of lands 63 are soldered 64, so that the high-frequency module M2 is connected to the wiring pattern 62 that is the external circuit provided on the motherboard 61, and the high-frequency module M2 is attached to the motherboard 61.

The electrodes 53 and the lands 63 are soldered using cream solder or by Ball Grid Array (connection by means of metallic balls).

The high-frequency module mounting structure in the related art has a problem in that solder 64 is liable to be peeled because of shrinkage of the circuit board 51 or the motherboard 61 under the environmental influence because soldering is made only between the electrodes 53 on the high-frequency module M2 and the lands 63 on the motherboard 61, and thus reliability is not sufficient.

SUMMARY OF THE INVENTION

Accordingly, it is an object of the present invention to provide a reliable high-frequency module mounting structure in which peeling of solder is prevented.

In order to achieve the above-described object, the invention provides a high-frequency module mounting structure including a high-frequency module having a circuit board formed with a desired circuit, a plurality of electrodes to be connected to an external circuit formed on the lower surface of the circuit board, a motherboard on which the circuit board is mounted, a plurality of lands disposed on the motherboard corresponding to the electrodes, the plurality of electrodes including first and second electrode groups, the first and second electrode groups each including a plurality of electrodes disposed along opposed sides of the circuit board respectively, the circuit board including reinforcing electrodes on the lower surface thereof for increasing a mounting strength of the first and second electrode groups in a state of being in close proximity, the motherboard including reinforcing lands corresponding to the reinforcing electrodes in a state of being in close proximity to the lands, and the electrodes and the lands, and the reinforcing electrodes and the reinforcing lands being soldered.

Preferably, the reinforcing electrodes are disposed outside and/or inside the electrodes.

Preferably, the reinforcing electrodes are disposed between the adjacent electrodes at the position deviated from a line connecting the centers of the adjacent electrodes.

Preferably, at least one of the reinforcing electrodes and one of the electrodes are in electrical communication with each other.

Preferably, a plurality of central reinforcing electrodes are formed at the center of the lower surface of the circuit board at the position between the first and second electrode groups, and the central reinforcing electrodes are soldered to the reinforcing lands provided on the motherboard.

DESCRIPTION OF THE PREFERRED EMBODIMENTS

Figure 1:
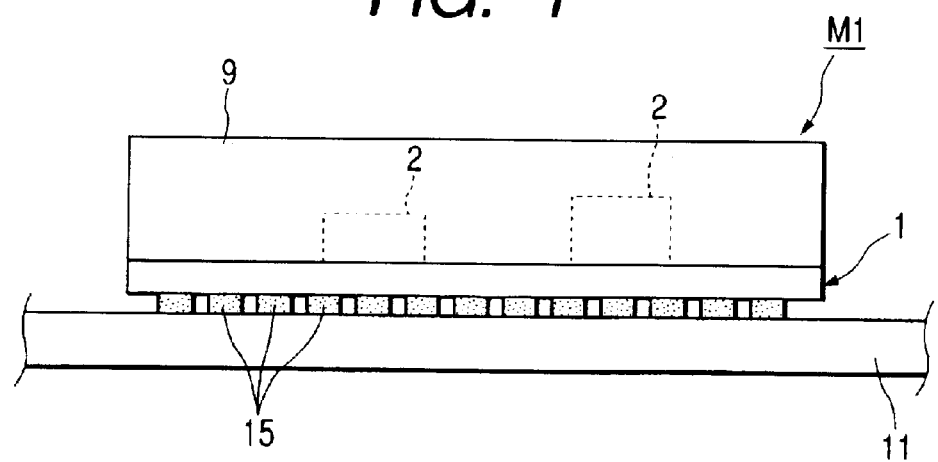
FIG. 1 is a side view showing a high-frequency module mounting structure according to the present invention.

Referring now to the drawings, a high-frequency module mounting structure according to the present invention will be described. FIG. 1 is a side view showing a high-frequency module mounting structure according to the present invention, FIG. 2 is an enlarged cross sectional view showing a principal portion of the high-frequency module mounting structure according to the present invention, and FIG. 3 is a bottom view of the high-frequency module relating to the high-frequency module mounting structure according to the present invention.

Figure 2:
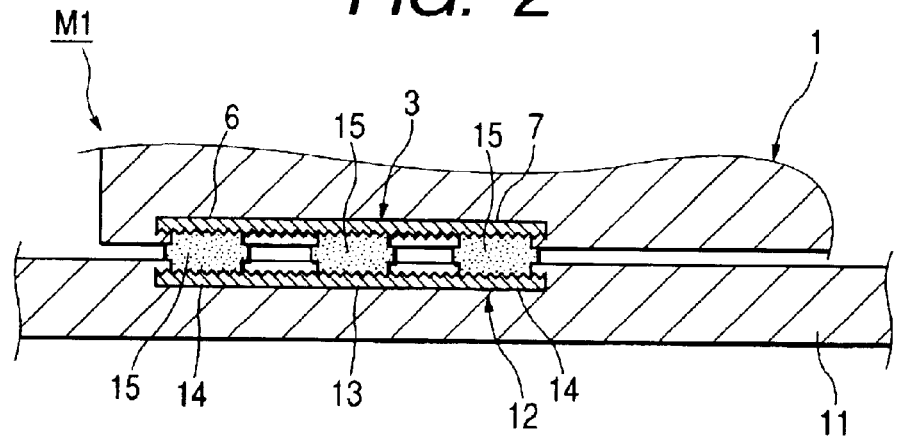
FIG. 2 is an enlarged cross sectional view showing a principal portion of a high-frequency module according to the present invention.
Figure 3:
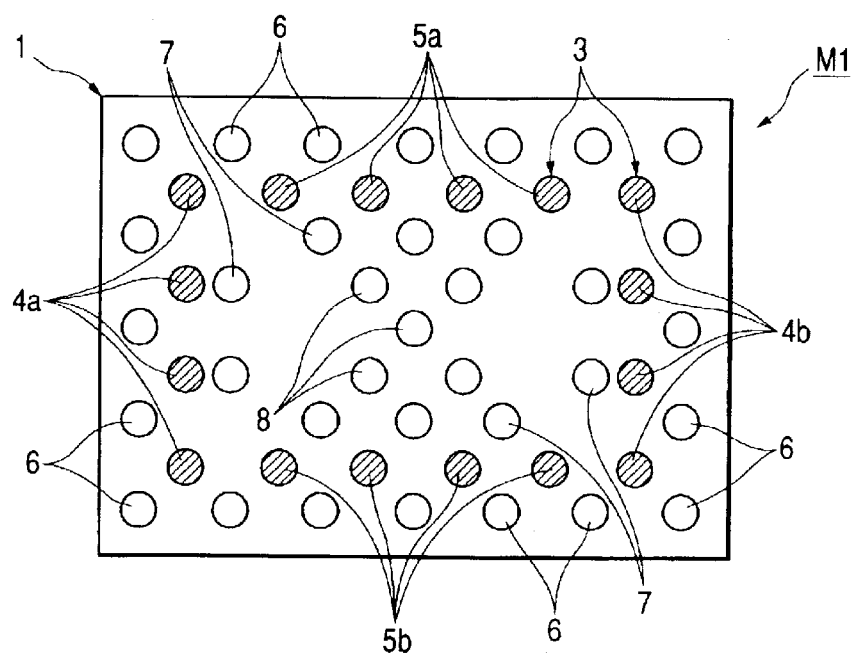
FIG. 3 is a bottom view of the high-frequency module relating to the high-frequency module mounting structure according to the present invention.
Figure 4:
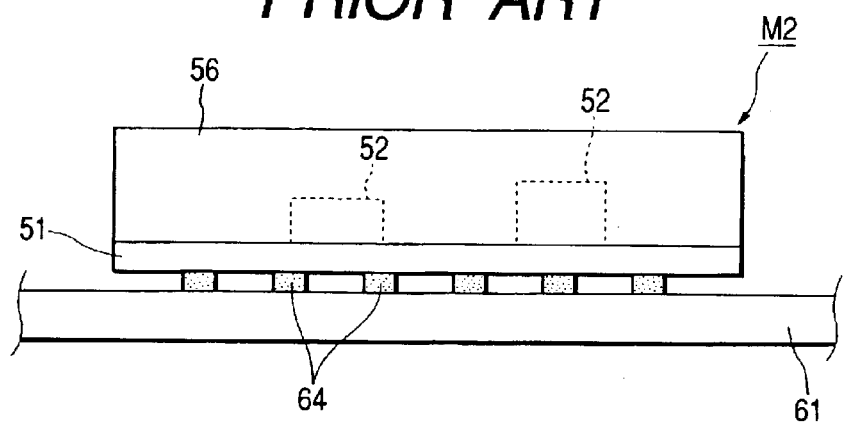
FIG. 4 is a side view showing the high-frequency module mounting structure.
Figure 5:
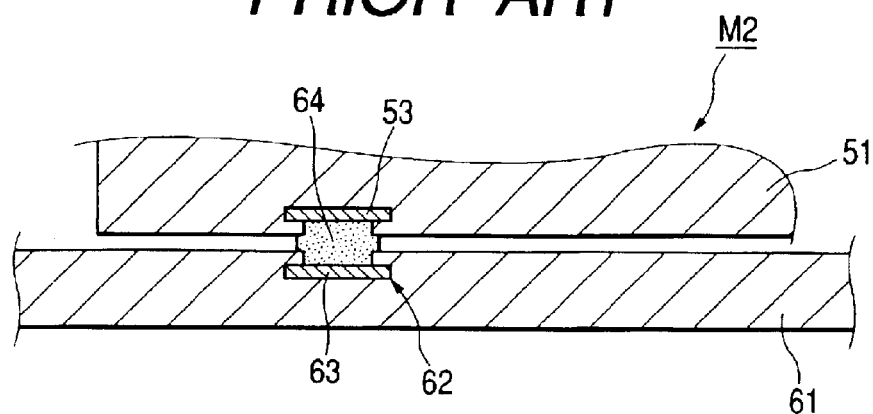
FIG. 5 is an enlarged cross sectional view showing a principal portion of the high-frequency module mounting structure in the related art.
Figure 6:
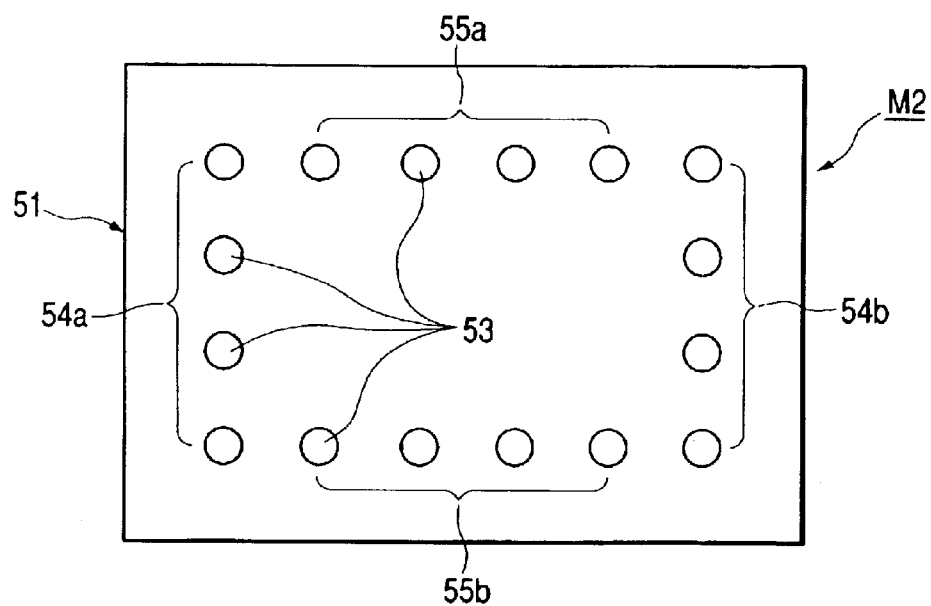
FIG. 6 is the high-frequency module mounting structure in the related art, showing a bottom view of the high-frequency module.

Referring now to FIG. 1 to FIG. 3, a framework of the high-frequency module mounting structure according to the present invention will be described. A square circuit board 1 formed of a printed board includes a wiring pattern (not shown) on one side, and electric components 2, such as an IC part, a chip capacitor, and a chip resistance mounted thereon, in a state of being connected to the wiring pattern, so that a desired electric circuit is formed.

As shown in particular in FIG. 3, the circuit board 1 includes a plurality of electrodes 3 (portions marked with diagonal lines in FIG. 3) to be connected with an external circuit on the lower surface of the circuit board 1, and the electrodes 3 are connected to the wiring pattern via a through hole (connecting conductor) so as to be capable of surface mounting, though it is not shown in the figure.

The electrodes 3 are disposed along four sides of the circuit board 1 by plural number each, and includes first and second electrode groups 4a and 4b disposed along opposed pair of sides respectively and the third and fourth electrode groups 5a and 5b disposed along another opposed pair of sides respectively.

As shown in particular in FIG. 3, the circuit board 1 includes a plurality of reinforcing electrodes 6 corresponding to the first, second, third, and fourth electrode groups 4a, 4b, 5a and 5b respectively are disposed outside the first and second electrode groups 4a and 4b and the third and fourth electrode groups 5a and 5b in close proximity to the electrodes 3, and a plurality of reinforcing electrodes 7 corresponding to the first, second, third, and fourth electrode groups 4a, 4b, 5a and 5b respectively are disposed inside the first and second electrode groups 4a and 4b and the third and fourth electrode groups 5a and 5b in close proximity to the electrodes 3.

The reinforcing electrodes 6 and 7 are disposed between the adjacent electrodes 3 at the position deviated from a line connecting the centers of the adjacent electrodes 3, or/and the reinforcing electrodes 6 and 7 are disposed in line with the electrodes 3.

Connection of one electrode 3 is reinforced by two reinforcing electrodes 6 positioned obliquely outsides thereof as will be described later, and reinforced by two reinforcing electrodes 7 disposed obliquely inside thereof or by the reinforcing electrode 7 disposed in line with the electrode 3.

As a consequence, at least one to several reinforcing electrodes 6 or 7 are provided for the single electrode 3.

As shown in particular in FIG. 2, the reinforcing electrodes 6 and 7 are in electrical communication with the single electrode 3 via a conducting pattern.

Alternatively, it is also possible to bring each electrode 3 in electrical communication with at least one reinforcing electrode, or to bring only arbitrarily selected electrodes 3 in electrical communication with the reinforcing electrodes.

Although the reinforcing electrodes 6 and 7 are provided inside and outside the electrode 3 in the description above, it is also applicable to provide only one of the reinforcing electrodes 6 or 7, or to provide a plurality of reinforcing electrodes for each of the first, second, third and fourth electrode groups.

As shown in particular in FIG. 3, the circuit board 1 is provided with a plurality of reinforcing electrodes 8 at the center of the lower surface between the first and second electrode groups 4a and 4b, and between the third and fourth electrode groups 5a and 5b.

The surfaces of the electrodes 3, the reinforcing electrodes 6 and 7 and reinforcing electrode 8 at the center are finished into rough surfaces for enhancing the strength of soldering.

A box-shaped cover 9 formed of a metallic plate is attached to the circuit board 1 by a suitable measure, such as soldering, so as to cover one surface of the circuit board 1.

The cover 9 electrically shields between the electric component 2 and the wiring pattern to form a high-frequency module M1.

A motherboard 11 formed of the printed board includes a wiring pattern 12, and the wiring pattern 12 includes a plurality of lands 13 at the positions corresponding to the electrodes 3 of the high-frequency module M1 and a plurality of reinforcing lands 14 at the positions corresponding to the reinforcing electrodes 6, 7, and 8.

The reinforcing lands 14 disposed in close proximity to the lands 13 are in electrical communication with the respective lands 13 via the conducting pattern.

The surfaces of the lands 13 and the reinforcing lands 14 are finished into rough surfaces for enhancing the strength of soldering.

The high-frequency module M1 is placed on the motherboard 11, connected to the wiring pattern 12 that is an external circuit provided on the motherboard 11, and attached to the motherboard 11 by soldering 15 between the plurality of electrodes 3 and the plurality of lands 13 and between the reinforcing electrodes 6, 7, and 8 and the reinforcing lands 14.

The high-frequency module M1 is soldered 15 with the motherboard 11 by surface mounting using cream solder or a Ball Grid Array (connection by means of metallic balls).

When the high-frequency module M1 is mounted in such a manner, soldering 15 between the high-frequency module M1 and the motherboard 11 is enhanced by soldering between the reinforcing electrodes and the reinforcing lands, and thus solder 15 may be prevented from peeling. Even when solder 15 of the electrode 3 is peeled off, connection between the motherboard 11 and the wiring pattern 12 is secured by the reinforcing electrodes 6 and 7 in electrically communication with the electrodes 3, whereby a very reliable high-frequency module mounting structure is obtained.

Although the electrode 3 includes the first, second, third, and fourth electrode groups in this embodiment, the electrode 3 may includes only the first and second electrode groups, or only the third and fourth electrode groups.

The high-frequency module mounting structure according to the present invention includes a high-frequency module having the circuit board formed with a desired circuit, a plurality of electrodes to be connected to the external circuit formed on the lower surface of the circuit board, a motherboard on which the circuit board is mounted, and a plurality of lands disposed on the motherboard corresponding to the electrodes, the plurality of electrodes includes first and second electrode groups, the first and second electrode groups each including a plurality of electrodes disposed along opposed sides of the circuit board respectively, the circuit board including the reinforcing electrodes on the lower surface thereof for increasing a mounting strength of the first and second electrode groups in a state of being in close proximity, the motherboard including reinforcing lands corresponding to the reinforcing electrodes in a state of being in close proximity to the reinforcing electrodes, and the electrodes and the lands, and the reinforcing electrodes and the reinforcing lands being soldered. Therefore, soldering between the high-frequency module and the motherboard is enhanced by soldering between the reinforcing electrodes and reinforcing lands, and thus solder is prevented from peeling, whereby a highly reliable high-frequency module mounting structure is provided.

Since the reinforcing electrodes are disposed outside and/or inside the electrodes, arrangement of the reinforcing electrodes may be selected as desired, and flexibility in design is achieved.

Since the reinforcing electrodes are disposed between the adjacent electrodes at the position deviated from a line connecting the centers of the adjacent electrodes, compact arrangement of the reinforcing electrodes is achieved, and a number of reinforcing electrodes can be disposed. Therefore, solder peeling is positively prevented, and thus a reliable high-frequency module mounting structure is provided.

Since at least one of the reinforcing electrodes and one of the electrodes are in electrical communication with each other, even when solder of the electrode is peeled off, the reinforcing electrodes in electrically communication with the electrodes ensure connection between the motherboard and the wiring pattern, and thus a very reliable high-frequency module mounting structure is obtained.

Furthermore, since a plurality of central reinforcing electrodes are formed at the center of the lower surface of the circuit board at the position between the first and second electrode groups, and the central reinforcing electrodes are soldered to the reinforcing lands provided on the motherboard, soldering between the high-frequency module and the motherboard is further enhance. Therefore, solder is prevented from peeling off and thus a very reliable high-frequency module mounting structure is obtained.

What is claimed is:

1. A high-frequency module mounting structure comprising:

a high-frequency module having a circuit board formed with a desired circuit, a plurality of electrodes to be connected to an external circuit formed on a lower surface of said circuit board;

a motherboard on which said circuit board is mounted;

a plurality of lands disposed on said motherboard corresponding to said electrodes, said plurality of electrodes including first and second electrode groups, said first and second electrode groups each including a plurality of electrodes disposed along opposed sides of said circuit board respectively, said circuit board including reinforcing electrodes on the lower surface thereof for increasing a mounting strength of said first and the second electrode groups in a state of being in close proximity;

said motherboard including reinforcing lands corresponding to said reinforcing electrodes in a state of being in close proximity to said lands; and said electrodes and said lands being soldered, and said reinforcing electrodes and said reinforcing lands being soldered, wherein at least one of said reinforcing electrodes and at least one of said electrodes are in electrical communication with each other;

wherein a plurality of central reinforcing electrodes are formed at the center of a lower surface of said circuit board at a position between said first and the second electrode groups, and said central reinforcing electrodes are soldered to said reinforcing lands provided on said motherboard.

2. A high-frequency module mounting structure according to claim 1, wherein said reinforcing electrodes are disposed at least one outside and inside of said electrodes.

3. A high-frequency module mounting structure according to claim 1, wherein said reinforcing electrodes are disposed between adjacent electrodes at a position that deviates from a line connecting the centers of said adjacent electrodes.

4. A high-frequency module mounting structure comprising:

a high-frequency module having a circuit board formed with a desired circuit, a plurality of electrodes to be connected to an external circuit formed on a lower surface of said circuit board;

a motherboard on which said circuit board is mounted;

a plurality of lands disposed on said motherboard corresponding to said electrodes, said plurality of electrodes including first and second electrode groups, said first and second electrode groups each including a plurality of electrodes disposed along opposed sides of said circuit board respectively, said circuit board including reinforcing electrodes on the lower surface thereof for increasing a mounting strength of said first and the second electrode groups in a state of being in close proximity, said motherboard including reinforcing lands corresponding to said reinforcing electrodes in a state of being in close proximity to said lands; and said electrodes and said lands being soldered, and said reinforcing electrodes and said reinforcing lands being soldered, wherein said reinforcing electrodes are disposed both outside and inside of said electrodes;

wherein at least one of said reinforcing electrodes and at least one of said electrodes are in electrical communication with each other, wherein said reinforcing electrodes are disposed between adjacent electrodes at a position that deviates from a line connecting the centers of said adjacent electrodes.

5. A high-frequency module mounting structure comprising:

a high-frequency module having a circuit board formed with a desired circuit, a plurality of electrodes to be connected to an external circuit formed on a lower surface of said circuit board, a motherboard on which said circuit board is mounted, a plurality of lands disposed on said motherboard corresponding to said electrodes, said plurality of electrodes including first and second electrode groups, said first and second electrode groups each including a plurality of electrodes disposed only along opposed sides of said circuit board respectively, said circuit board including reinforcing electrodes on the lower surface thereof for increasing a mounting strength of said first and the second electrode groups in a state of being in close proximity;

said motherboard including reinforcing lands corresponding to said reinforcing electrodes in a state of being in close proximity to said lands; and said electrodes and said lands being soldered, and said reinforcing electrodes and said reinforcing lands being soldered;

wherein at least one of said reinforcing electrodes and one of said electrodes are in electrical communication with each other; wherein said reinforcing electrodes are disposed at least one of outside and inside said electrodes; wherein said reinforcing electrodes are disposed between adjacent electrodes at a position that deviates from a line connecting the centers of said adjacent electrodes.

* * * * *